(12) United States Patent
Bailey

(10) Patent No.: US 8,106,796 B2
(45) Date of Patent: Jan. 31, 2012

(54) INTELLIGENT FLOOR MAT WITH EMAIL TEXT TO VOICE PROCESSING

(76) Inventor: Ada Cannon Bailey, Chalton, NY (US)

(*) Notice: Subject to any disclaimer, the term of this patent is extended or adjusted under 35 U.S.C. 154(b) by 756 days.

(21) Appl. No.: 12/250,718

(22) Filed: Oct. 14, 2008

(65) Prior Publication Data

US 2009/0033520 A1  Feb. 5, 2009

Related U.S. Application Data

(62) Division of application No. 10/570,519, filed as application No. PCT/US2004/024877 on Aug. 2, 2004, now Pat. No. 7,436,325.

(60) Provisional application No. 60/491,562, filed on Aug. 1, 2003.

(51) Int. Cl.
*H03M 11/00* (2006.01)

(52) U.S. Cl. ............... 341/20; 463/36; 463/39; 345/168

(58) Field of Classification Search .................. 341/20, 341/173, 176; 73/768; 345/157, 168; 463/36, 463/39; 273/148 B, 331
See application file for complete search history.

(56) References Cited

U.S. PATENT DOCUMENTS

| | | | |
|---|---|---|---|
| 4,121,488 A | 10/1978 | Akiyama | |
| 4,204,096 A | 5/1980 | Barcus et al. | |
| 4,772,028 A | 9/1988 | Rockhold et al. | |
| 4,796,013 A | 1/1989 | Yasuda et al. | |
| 5,040,331 A | 8/1991 | Merendino et al. | |
| 5,139,261 A | 8/1992 | Openiano | |
| 5,515,043 A | 5/1996 | Berard et al. | |
| 5,640,145 A | 6/1997 | Newham | |
| 5,855,483 A | 1/1999 | Collins et al. | |
| 5,889,510 A | 3/1999 | Klarlund | |
| 5,913,727 A | 6/1999 | Ahdoot | |
| 6,450,886 B1 | 9/2002 | Oishi et al. | |
| 6,580,060 B1 | 6/2003 | Inman et al. | |
| 6,600,477 B1 | 7/2003 | Howell | |
| 6,812,594 B2 | 11/2004 | Face et al. | |
| 7,170,248 B2 | 1/2007 | Tsui et al. | |
| 7,199,702 B2 | 4/2007 | Lizza | |
| 7,436,325 B2 | 10/2008 | Bailey | |
| 2003/0055596 A1 | 3/2003 | Studt et al. | |

FOREIGN PATENT DOCUMENTS

| | | |
|---|---|---|
| DE | 19810755 A1 | 9/1999 |
| DE | 10135929 A1 | 2/2003 |
| FR | 261747 | 7/1990 |
| FR | 2641747 | 7/1990 |
| JP | 01-097398 | 4/1989 |
| JP | 04-133904 | 5/1992 |

OTHER PUBLICATIONS

Office Action issued in Japanese Application No. 2006-522654, mailed Apr. 27, 2010.

(Continued)

*Primary Examiner* — Albert Wong
(74) *Attorney, Agent, or Firm* — DLA Piper LLP US

(57) ABSTRACT

A floor mat suitable for a vehicle is shown in FIG. 1 includes a circuit for operating remotely controllable devices both inside a vehicle or outside a vehicle. In another embodiment of the invention, a floor mat receives email from a wireless email device such as a BLACKBERRY, performs a text-to-voice recognition process on the contents of the email, and outputs a voice signal to a speaker such that the email is read to the user. This allows a user to review email messages without taking his or her eyes away from the road.

16 Claims, 8 Drawing Sheets

OTHER PUBLICATIONS

English language translation of Office Action issued in Japanese Application No. 2006-522654, mailed Apr. 27, 2010.
English language abstract of JP 04-133904, published May 7, 1992.
English language abstract of JP 01-097398, published Apr. 14, 1989.
English language abstract of FR 2,641,747, published Jul. 20, 1990.
European Search Report, issued in EP 04 77 9824, dated May 30, 2008.

INTELLIGENT FLOOR MAT WITH EMAIL TEXT TO VOICE PROCESSING

CROSS REFERENCE TO RELATED APPLICATIONS

This application is a division of U.S. patent application Ser. No. 10/570,519, filed Mar. 3, 2006, now U.S. Pat. No. 7,436,325, the entire original contents of which are hereby incorporated by reference. This application claims priority from U.S. Provisional Application Ser. No. 60/491,562, entitled A Floor Mat for Operating Remotely-Controlled Devices, filed Aug. 1, 2003. The entirety of that provisional application is incorporated herein by reference.

BACKGROUND

1. Field of the Invention

This invention relates generally to floor mats and more particularly to floor mats suitable for use in motor vehicles.

2. Description of the Background

Almost all floor mats found in motor vehicles today do little more than protect the floor of the vehicle from dirt and damage from the user's feet. (As used herein, user includes both operators, or drivers, of motor vehicles as well as passengers in motor vehicles. Motor vehicle includes all types of automobiles including but not limited to passenger cars, trucks, trains, airplanes and boats.) Such limited use of floor mats ignores their potential to act as information processing centers and controllers for other devices. In various circumstances, using floor mats in this manner can improve both safety and convenience for the user. What is needed are methods and devices that can fully realize this potential.

SUMMARY

The present invention addresses the aforementioned issues to a great extent by providing a smart floor mat that has the ability to communicate with and/or control other devices and act as an information processing center. In one embodiment of the invention, a floor mat suitable for use in a motor vehicle provides a user with the ability to activate and/or deactivate remotely controllable devices with the user's foot or by other means, including by way of illustration and not limitation, with the user's voice. This leaves the user's hands free for other tasks. When the user is a driver, this feature can improve safety by allowing the driver to keep both hands on the steering wheel when activating the remotely controllable device. The remotely controllable devices may be inside the vehicle (e.g., a radio), or outside the vehicle (e.g., garage door openers, security systems, gates, electronic door locks, lighting systems, appliances, and the like).

In another embodiment of the invention, a floor mat is equipped with a transponder that will respond to interrogation systems such as those commonly used at toll booths on highways, bridges and tunnels. Incorporating the transponder into the floor mat rather than placing it on a windshield avoids obstructing the user's view, thereby improving safety.

In another embodiment of the invention, a GPS (global positioning system) receiver or other positioning system is incorporated into the floor mat along with a transmitter that will transmit the location of the motor vehicle to a remote tracking station. This allows the location of the vehicle to be tracked.

In yet another embodiment of the invention, a vibrating device is incorporated into the floor mat. The vibrating device causes the floor mat to vibrate under the control of a processor, which is also incorporated into the floor mat. The processor causes the vibrating device to activate and deactivate in a random or periodic pattern in order to help keep the user awake and alert, thereby improving safety.

In still another embodiment of the invention, a floor mat controls a back-up warning system. This allows selective activation and deactivation of the system by the user.

In another embodiment of the invention, a floor mat receives email from a wireless email device such as a BLACKBERRY, performs a text-to-voice recognition process on the contents of the email, and outputs a voice signal to a speaker such that the email is read to the user. This allows a user to review email messages without taking his or her eyes away from the road.

An aspect of the invention is that it is "pluggable," i.e., new functionality and technology may be added to an existing vehicle in an after-market environment through adding a floor mat and other associated devices (as will be explained more fully below) to the vehicle.

BRIEF DESCRIPTION OF THE DRAWINGS

The aforementioned advantages and features of the present invention will be more readily understood with reference to the following detailed description and the accompanying drawings in which.

DETAILED DESCRIPTION

In the following detailed description, a plurality of specific details such as types of communications systems and types of devices which may be controlled by a floor mat, are set forth in order to provide a thorough understanding of the present invention. The details discussed in connection with the preferred embodiments should not be understood to limit the present invention. Furthermore, for ease of understanding, certain method steps are delineated as separate steps; however, these steps should not be construed as necessarily distinct nor order dependent in their performance.

Figure 1:
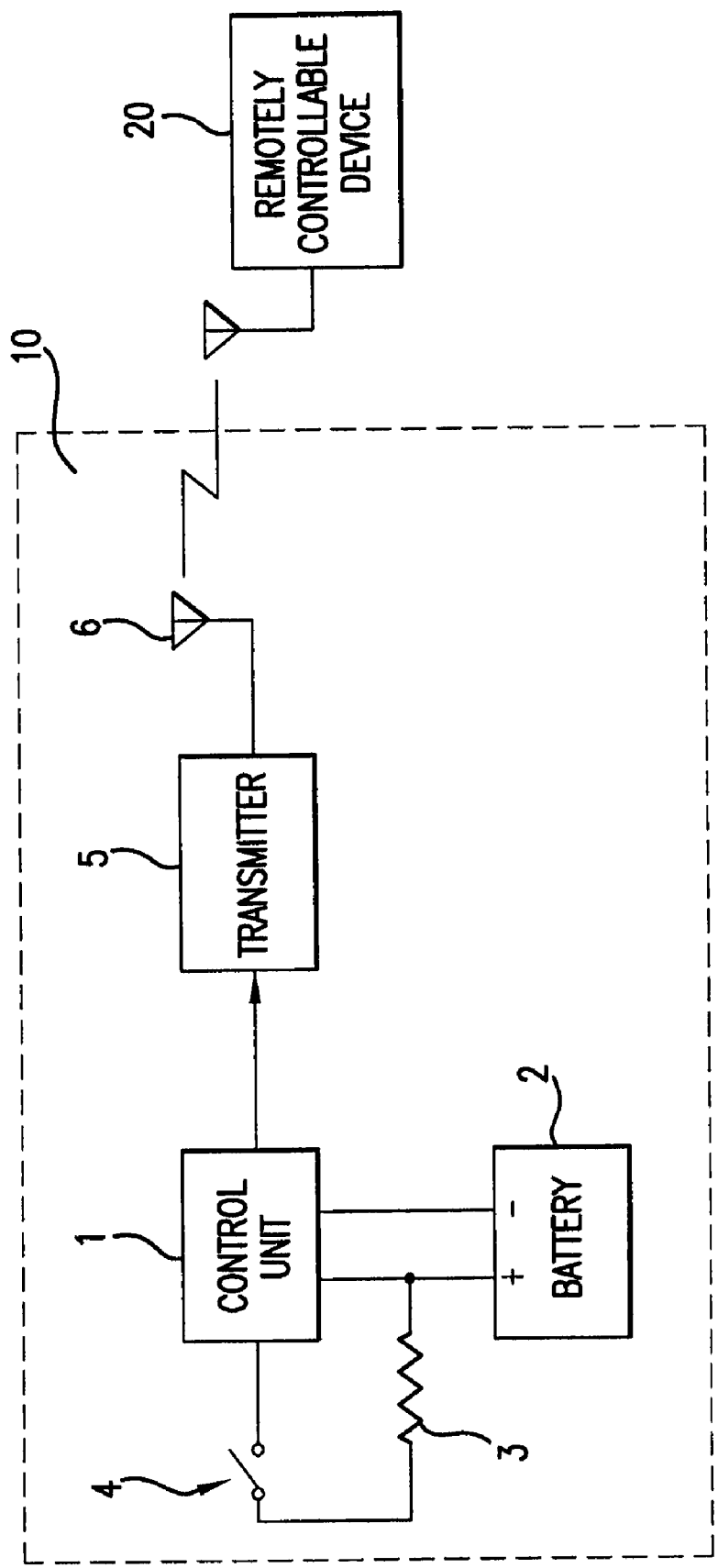
FIG. 1 is a block diagram of a floor mat control circuit for controlling a remotely controllable device according to a first embodiment of the present invention.

A block diagram of a circuit 10 operable to activate and/or deactivate a remotely controllable device 20 suitable for use in a floor mat according to an embodiment of the invention is illustrated in FIG. 1. The circuit 10 includes a control unit 1 powered by a battery 2. A resistor 3 and switch 4 are also connected in series between a positive terminal of the battery 2 and the control unit 1. The switch 4 is preferably a pressure sensitive, normally open switch suitable for activation by a user's foot. A transmitter 5 is also connected to the control unit. An antenna 6 is connected to the transmitter 5. The transmitter 5 and antenna 6 are preferably suitable for wirelessly transmitting messages to a remotely controllable device 20. The transmitter 5 may transmit at RF, microwave, or any other frequency known in the art. In normal operation, the control unit 1 detects a closure of the switch 4 and responds by generating a signal that is sent to the transmitter 5 for transmission via antenna 6 to the remotely controllable device 20.

As discussed above, there are a wide variety of remotely controllable devices 20 that may be controlled by a floor mat according to the present invention, including devices both inside and outside the vehicle. Devices outside of the vehicle include devices such as garage door openers, remote control gates, and electronic door locks that are specifically configured to be remotely controllable. However, the floor mat may also be used to control devices that are not ordinarily configured to be remotely controllable. Such devices may be controlled using the floor mat of the present invention by placing a remotely controllable power module between the power cord of the device and its power source (e.g., a wall receptacle). Examples of such remotely controllable power modules are those available from RadioShack under the PLUG 'N POWER™ mark and those available from X10 and others. Such modules are well known to those of skill in the art and will not be discussed in further detail herein. Thus, ordinary appliances (coffee makers, dishwashers, etc.), lights, and other electrically powered devices in the home may all be controlled with the floor mat of the present invention.

Devices inside the vehicle may also be controlled with a floor mat incorporating the circuit 10 of FIG. 1. For example, many new cars are now available with a Bluetooth-enabled radio. These radios allow hands-free operation with a Bluetooth-enabled cell phone. When the cell phone receives an incoming call, it will automatically send a mute signal to the radio so that the user can hear the phone call. Moreover, the cell phone can transmit the caller's voice to the car audio system so that the caller's voice can be heard over the car audio system. This system works fine if the user's cell phone is Bluetooth enabled. However, many cell phones are not Bluetooth enabled. Users with such phones must manually turn down the radio's volume in order to hear the call using such an older, non-Bluetooth cell phone. However, in some embodiments of the invention, the floor mat transmitter 5 is a Bluetooth transmitter and the control unit 1 will generate a signal that will mute the radio when the user activates the switch 4 with his or her foot, thereby leaving the user's hands free. The foregoing is but one example of a remotely controllable device located inside a vehicle that may be controlled using the floor mat of the present invention.

As is well known in the art, remotely controllable devices are often activated by a signal containing a code. The control unit 1 of circuit 10 is responsible for generating a signal including the required code in embodiments of the invention used with such devices. Some of these embodiments discussed herein are directed toward a specific remotely controllable device 20 for which the necessary code and other transmission parameters (e.g., carrier signal frequency) are known in advance. Thus, the control unit 1 can be configured in advance to generate the requisite signal and code in a manner well known in the art.

However, it is desirable to provide a floor mat capable of controlling a wide variety of remotely controllable devices. Accordingly, some embodiments of the invention are provided with control units 1 that are capable of duplicating signals including codes received from a remote control transmitter associated with a wide variety of remotely controllable devices. U.S. Pat. No. 6,556,813, the contents of which are hereby incorporated by reference herein, describes one known "universal transmitter" suitable for use in the present invention.

Figure 2:
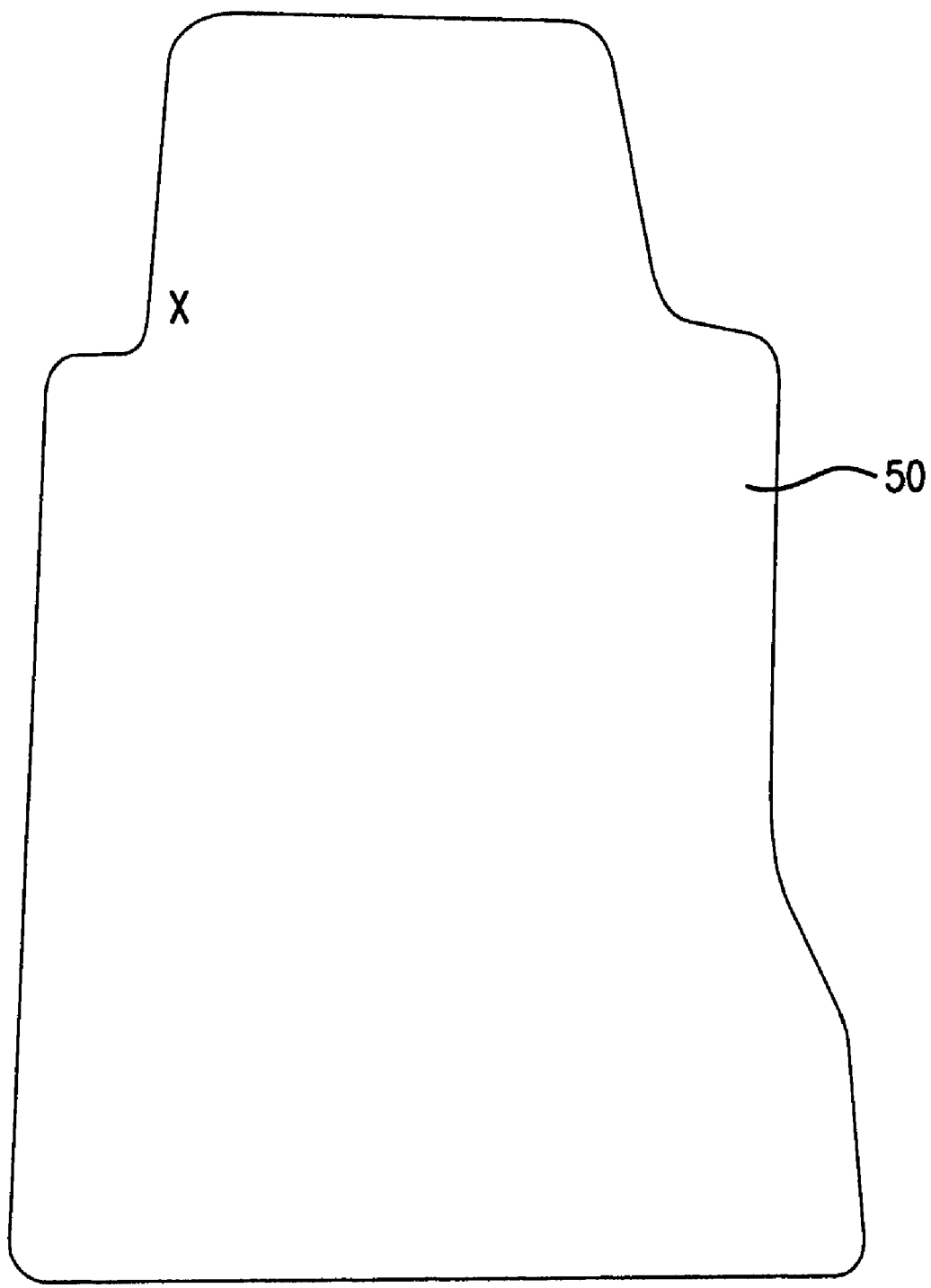
FIG. 2 is a schematic diagram showing a location of a switch of the floor mat control circuit of FIG. 1.

In order to avoid draining the battery 2 and avoid unintentional activation/deactivation of the remotely controllable device 20, the switch 4 is preferably placed in a position in which a user will not inadvertently step on the switch. An exemplary position for the switch 4 for a floor mat 50 placed in a driver's position is indicated by the "X" in FIG. 2. It should be understood that the floor mat 50 may be comprised of any material, including rubber, vinyl, plastic, cloth, carpet, and other materials. It should be further understood that the shape of the floor mat 50 is not limited to the shape illustrated in FIG. 2 and that the floor mat 50 may take any shape suitable for a vehicle.

In preferred embodiments of the invention, the circuit 10 is contained within the floor mat 50. Alternatively, the circuit 10 may be attached to the top or bottom surface of the floor mat 50. In these embodiments, the circuit 10 may be transferable from one floor mat 50 to another or may be permanently attached to a single floor mat 50.

In some embodiments of the invention, the components of the circuit 10 are mounted on a flexible patch of plastic film, which may be layered in the mat or have an adhesive affixed to one side for attachment to the bottom surface of a mat or a series of mats. As used herein, "adjacent to" includes all of the foregoing methods of incorporating the circuit into the floor mat.

The circuit 10, and all of the circuits discussed herein, may be realized using discrete components, as an integrated circuit on a single chip, a segmented chip, or a plurality of chips. The antenna 6 may be integrated into the floor mat or may be placed in a remote position (e.g., mounted to a dashboard or a surface on the outside of the car) and connected to the transmitter 5 by a cable.

Figure 3:
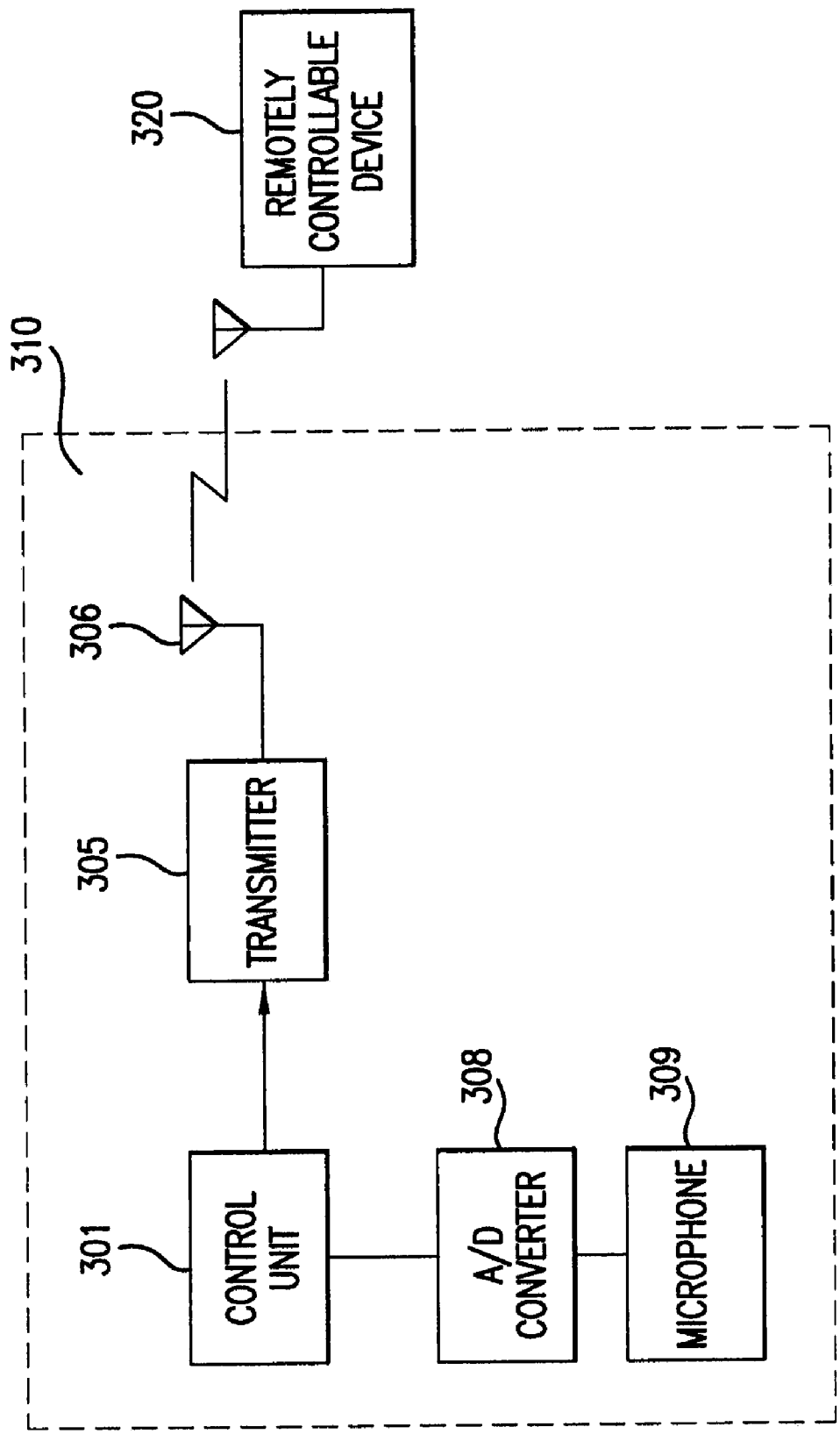
FIG. 3 is a block diagram of a floor mat control circuit for controlling a remotely controllable device according to a second embodiment of the present invention.

In the embodiments discussed above, the control unit 1 signals the remotely controllable device 20 upon activation of the switch 4 by a user's foot. In an alternative embodiment illustrated in FIG. 3, the switch 4 of the circuit 10 is replaced by an A/D converter 308 and a microphone 309 in the circuit 310. The circuit 310 allows the remotely controllable device 320 to be controlled by the user's voice. The microphone 309 detects a user's voice and converts it to an analog signal. The analog signal is converted to a digital signal by the A/D converter 308. The digital signal is then input to the control unit 301, which performs a voice recognition process on the digital signal. Such voice recognition processes are well known in the art and will not be discussed in further detail herein. When the voice recognition process in the control unit 301 detects a command from the user, a corresponding signal is sent to the transmitter 305. The transmitter 305 transmits the command to the remotely controllable device over antenna 306.

In yet alternative embodiments of the invention, the control unit is activated by the reception of a wireless signal rather than by activation of a switch. The wireless signal may be generated by a remotely controllable device that is to be controlled by the floor mat, or by some other device in the vicinity of the remotely controllable device. The control unit responds to the wireless signal by generating a second signal to activate the remotely controllable device. In this way, a remotely controllable device such as a garage door opener could be activated automatically when a vehicle enters a driveway without requiring the driver to take any action. Such embodiments may be provided with an override switch that would allow a driver to prevent the control unit from generating a signal to the remotely controllable device when automatic operation is not desired.

As discussed above, an aspect of the invention is that it allows existing vehicles to be updated to include new capabilities. Several of the embodiments discussed above can be incorporated into a vehicle with little or no modification to the vehicle. Thus, such embodiments are pluggable.

Figure 4:
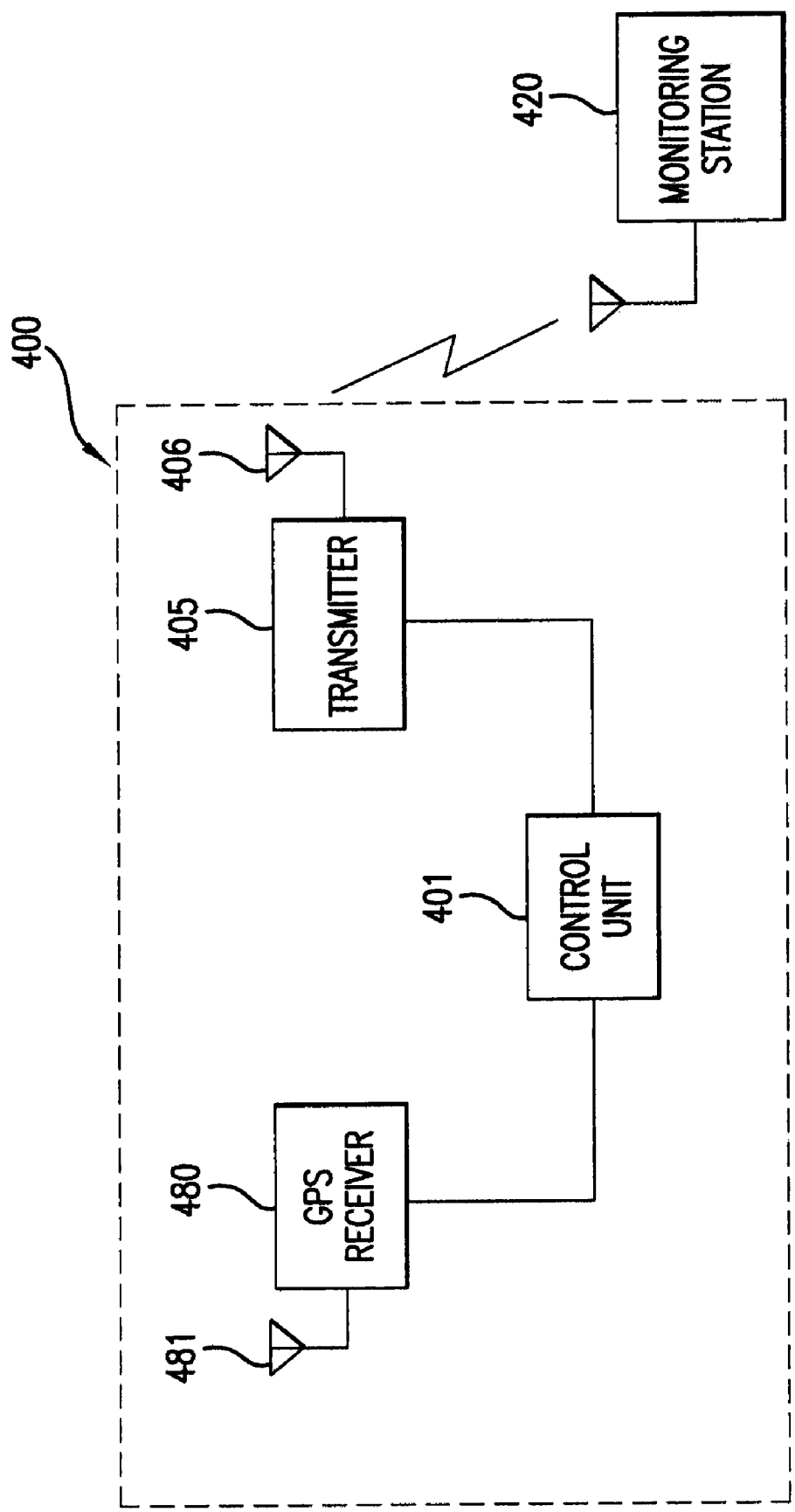
FIG. 4 is a block diagram of a floor mat including a tracking circuit according to a third embodiment of the present invention.

The embodiments discussed above have primarily been directed toward the control of remotely controllable devices. However, the invention is not limited to this function. A floor mat including a tracking circuit 400 is illustrated in FIG. 4. The tracking circuit allows the position of the floor mat, and hence the position of the motor vehicle in which the floor mat is installed, to be tracked by a tracking station 420. Such a system is useful for several purposes. It may be used by insurance companies to verify that a customer who claims to work a certain distance from his or her home does in fact work within that distance and not in an urban area a further distance away from the customer's home for which a higher premium would be due. Such a system may also be used by law enforcement authorities to track the motor vehicle in which the floor mat is installed if the motor vehicle is stolen.

The circuit 400 operates as follows. A GPS receiver 480 (or other positioning system) receives signals from a plurality of satellites via antenna 481. The GPS receiver may be a standard GPS receiver, a differential GPS receiver, or any other type of GPS receiver. The GPS receiver 480 calculates its position from these satellite signals and transmits this position to the control unit 401. The control unit 401 preferably performs a rough error check of the position from the GPS receiver 480 (e.g., the control unit 401 discards positions that are too different from previously reported positions) and periodically transmits a current position to a tracking station 420 via the transmitter 405 and antenna 406. In other embodiments, the control unit filters the positions received from the GPS receiver 480 to form a filtered position signal. It should be noted that the tracking station 420 may be at a location remote from the vehicle in which the floor mat is installed, or may be located in the vehicle (e.g., in the trunk of a passenger car). If the tracking station 420 is located in the vehicle, the transmitter 405 may be a Bluetooth transmitter and the tracking station 420 may record positions reported by the tracking circuit 400 on a removable recording medium such as a tape or floppy disk which can be removed for examination as desired.

Figure 5:
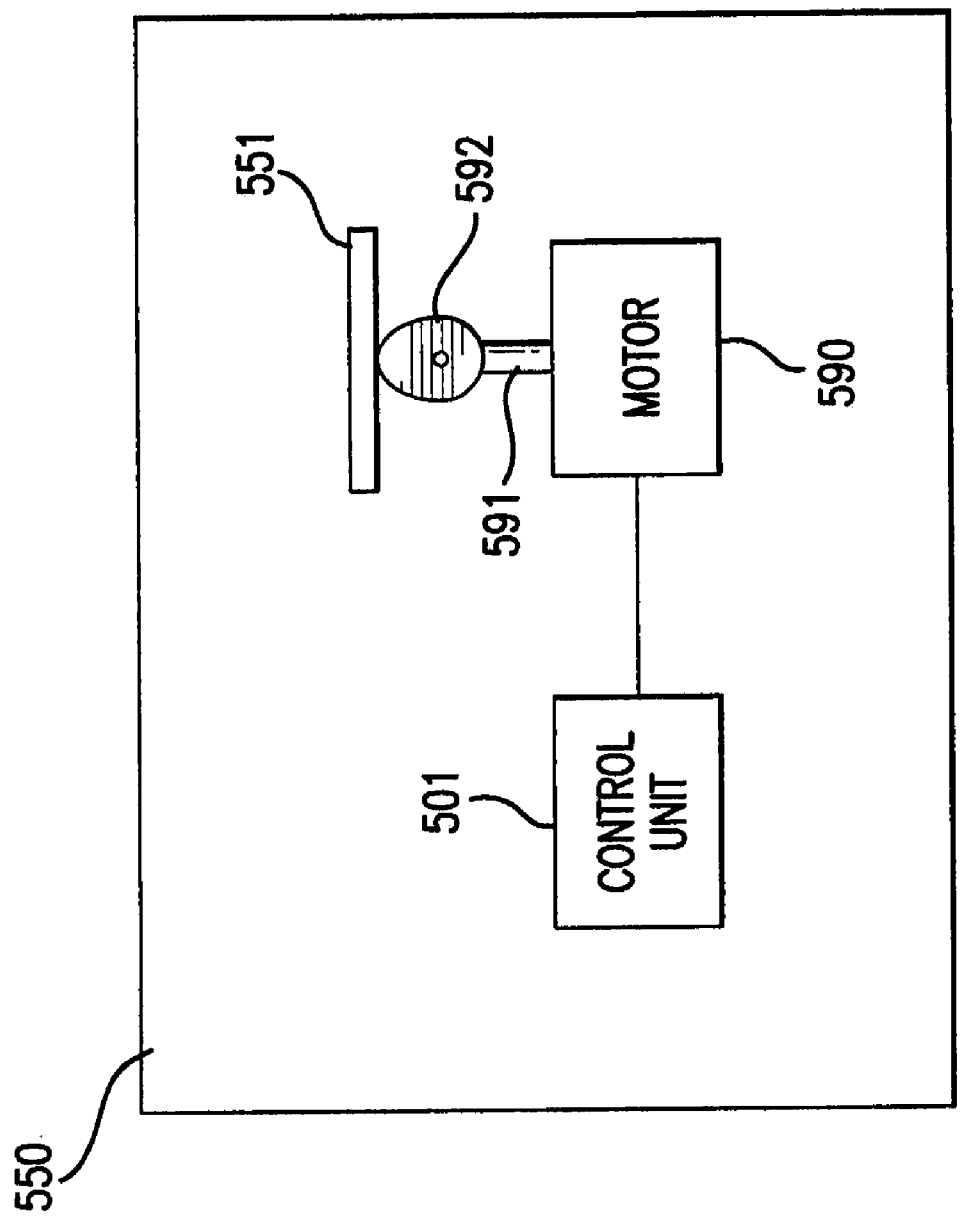
FIG. 5 is a block diagram of a floor mat incorporating a vibration plate according to a fourth embodiment of the present invention.

An embodiment of the invention that helps keep a driver awake and alert is illustrated in FIG. 5. A floor mat includes a vibrator circuit 550 that includes a control unit 501 configured to periodically activate and deactivate a motor 590. When activated, the motor turns a shaft 591 to which a cam 592 is connected. When the cam 592 turns, its irregular shape causes a plate 551 adjacent to the cam 592 to vibrate. The plate 592 is positioned in the floor mat such that its vibration will be sensed by a user's foot. Because the vibration is periodically activated rather than constant, the commencement and cessation of the vibration will attract the user's attention, thereby keeping the user awake and alert. As used herein, "periodic" means from time to time and includes both regular and irregular (including random) differences in time between activations and deactivations of the motor 590. In one embodiment of the invention, the control unit 501 turns the motor 590 on for approximately 2 seconds, leaves the motor off for approximately 20 seconds, and then repeats this process. In the embodiment of FIG. 5, the user has no control over activation of the motor 550 by the control unit 501. In an alternative embodiment, a switch is provided that allows the user to enable and disable the circuit 550 so that the vibration feature may be turned off when not wanted.

Figure 6:
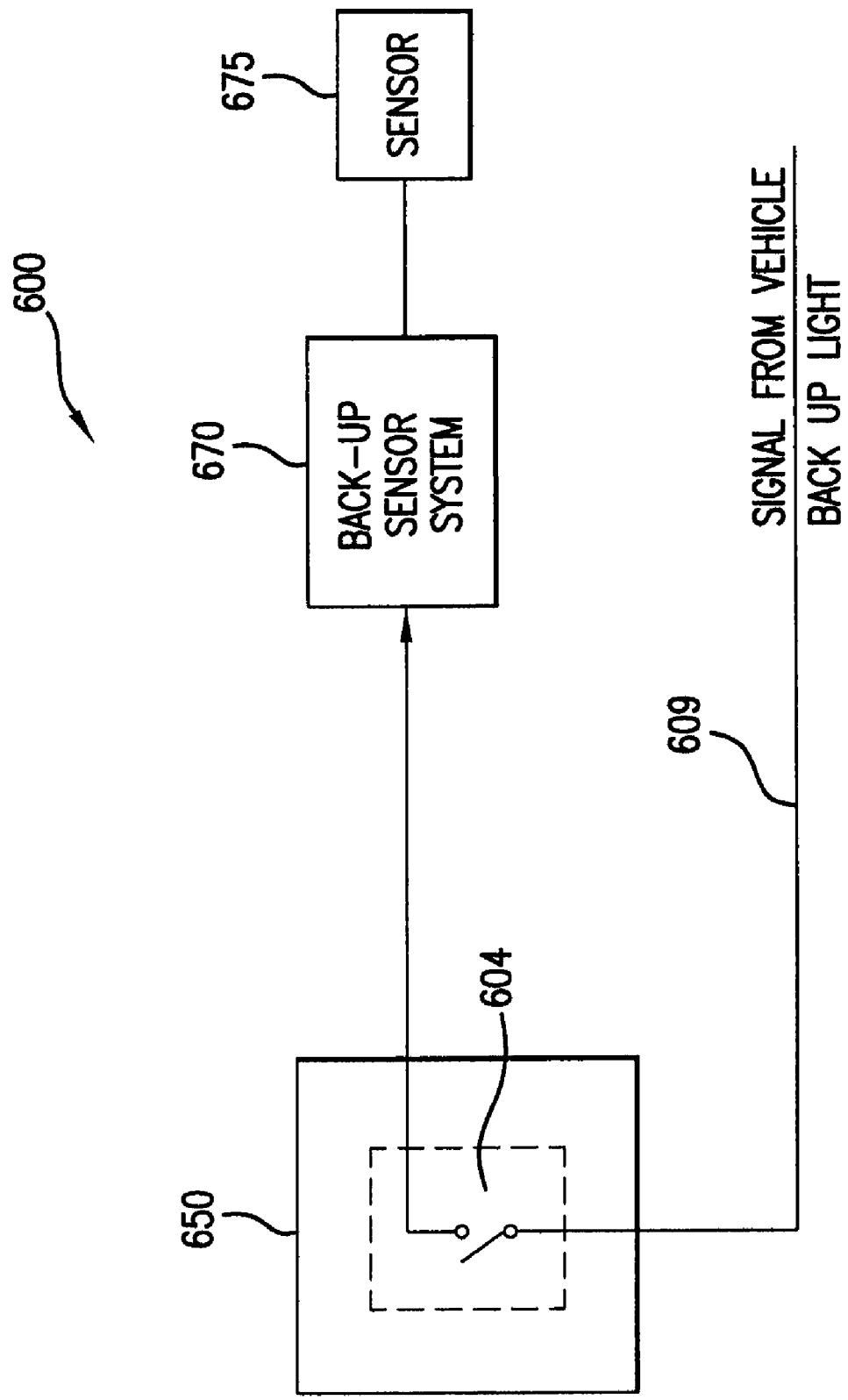
FIG. 6 is a block diagram of a floor mat that includes a switch for activating a back-up sensor system according to a fifth embodiment of the present invention.

FIG. 6 illustrates a floor mat 650 that is configured to control a collision avoidance system 670. Collision avoidance systems are well known in the art. Generally, these systems employ ultrasonic, infrared or radar transmitters and sensors to detect the presence of an object behind a vehicle. One such collision avoidance system is the REVERSEGUARD® system available from American Road Products, which is a back-up sensor system (e.g., a sensor system that detects when an object is in the path of a vehicle traveling in reverse). This system mounts on a license plate frame and automatically activates when a vehicle's reverse lights are turned on (thus, the REVERSEGUARD® system treats the application of power to the backup lights as a signal that determines when the REVERSEGUARD® system should be activated. Other back-up and collision avoidance systems may also be used in the context of the present invention, including those described in U.S. Pat. Nos. 6,594,614 and 5,314,037, both of which are incorporated herein by reference.

As useful as such systems are, there are times when they can become a nuisance. The floor mat 650 allows a user to deactivate a system in such situations. A wire 609 carrying signal that activates the back-up sensor system 670 (such as a signal corresponds to activation of the back up lights as is used by the aforementioned REVERSEGUARD® system) is connected to a switch 604 in the floor mat 650. The other side of the switch 604 is connected to an activation input of the sensor system 670, which controls a sensor 675 that monitors the rear of the vehicle for objects in the vehicle's path. By controlling the switch 650, the user can selectively activate and deactivate the sensor system 670.

It will be understood by those of skill in the art that the floor mat 650 described above may be added to a vehicle in which a collision avoidance system has previously been installed. Alternatively, the collision avoidance system and floor mat 650 may be added to the vehicle at the same time.

Figure 7:
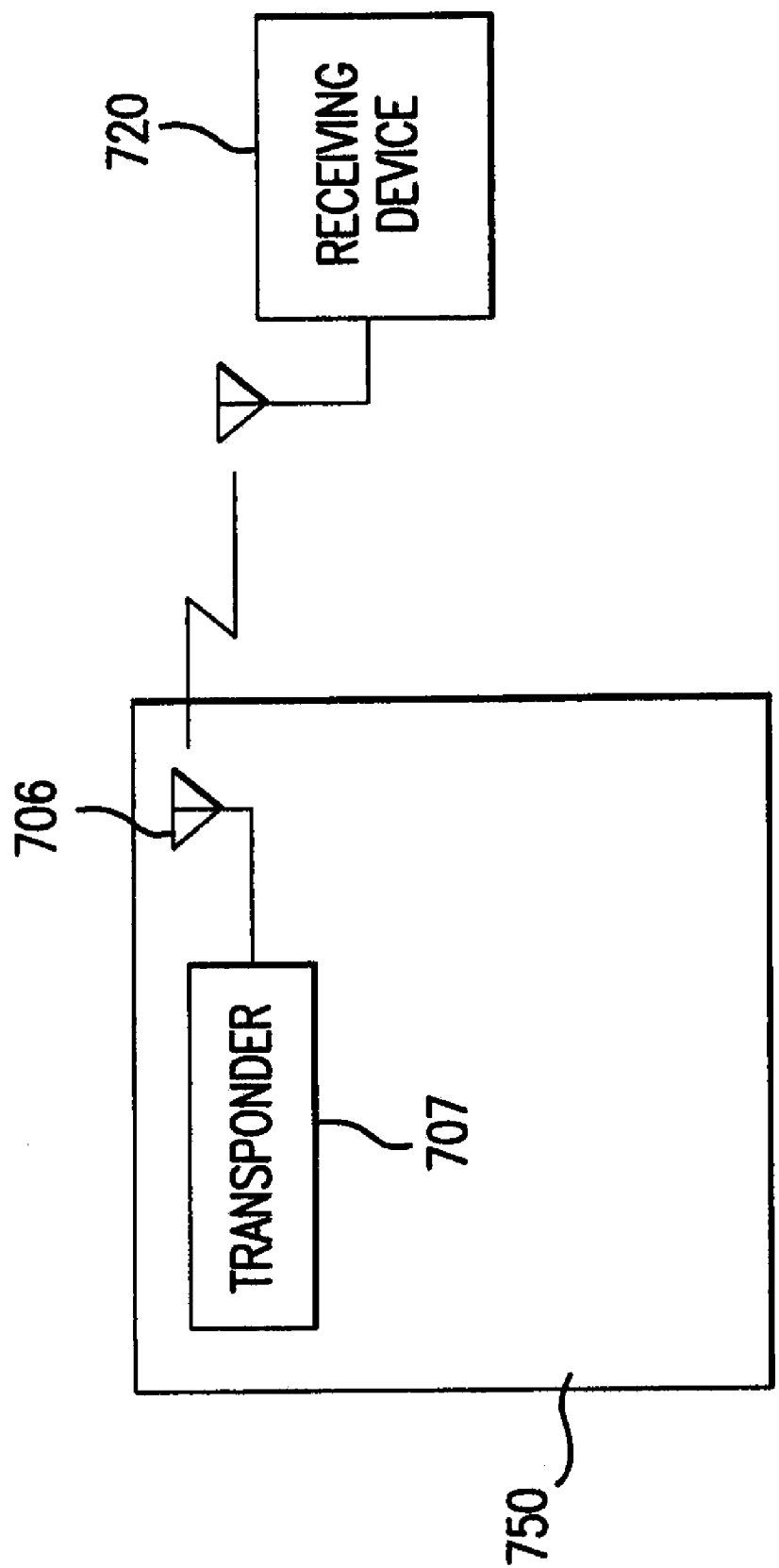
FIG. 7 is a block diagram of a floor mat including an identification transponder according to a sixth embodiment of the present invention.

FIG. 7 illustrates a floor mat 750 that includes a transponder 707. The transponder 707 may be used to identify the vehicle in which the floor mat 750 is placed to a receiving device 720 such as the toll devices found on many highways, bridges and tunnels. The transponder 707 may be of any type known in the art, including those used in the EZ-PASS™ system. By incorporating the transponder 707 into the floor mat 750, the need to mount a transponder on a windshield and/or the need to retrieve a transponder from a glovebox or other storage area is eliminated. This improves the user's field of vision and/or keeps the user's hands free.

Figure 8:
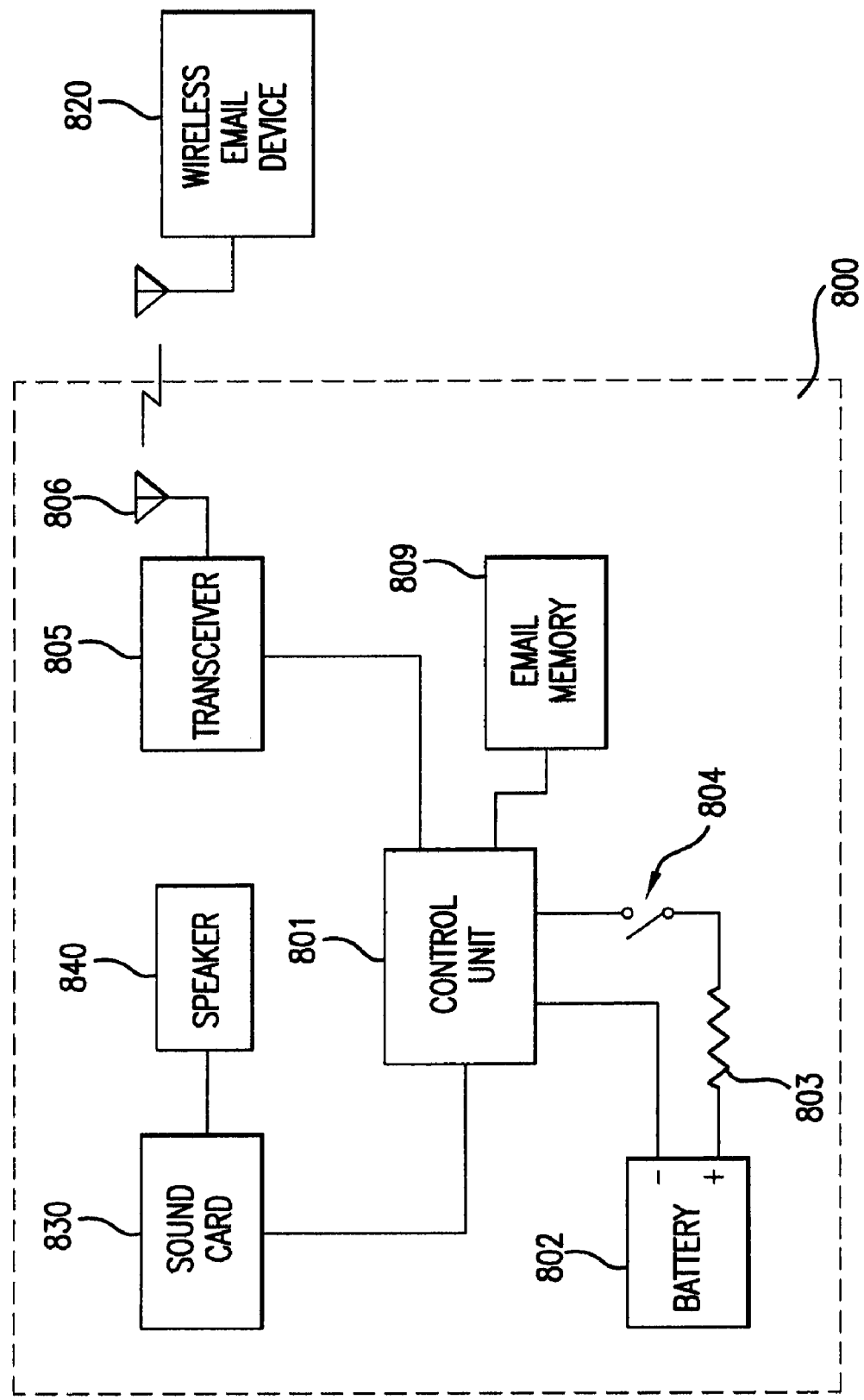
FIG. 8 is a block diagram of a floor mat configured to receive and read an email to a user according to a seventh embodiment of the invention.

FIG. 8 illustrates a floor mat that includes a circuit 800 configured to receive email from a user's wireless email device and read the email to the user. This allows a user to review email while in the car without requiring use of the user's eyes or hands. In preferred embodiments, the wireless email device is a BLACKBERRY® wireless portable digital assistant, more preferably still a BLACKBERRY® wireless portable digital assistant configured to synchronize using a Bluetooth wireless interface (alternatively, the BLACKBERRY® wireless portable digital assistant configured to synchronize using a traditional wired interface).

The circuit 800 works as follows. When the wireless email device 820 is in the vicinity of the circuit 800, a synchronization process between the device 820 and the circuit 800 is initiated in a manner well known in the art. In this synchronization process, all email messages held by the wireless email device 820 that are not already stored in the email memory 809 of the circuit 800 are downloaded from the wireless email device 820 to the email memory 809 via the transceiver 805 and antenna 806 under the control of the control unit 801. As discussed above, the transceiver 805 is preferably configured to conform to the Bluetooth standard.

When a user activates a switch 804 (connected between the control unit 801 and a battery 802 via a resistor 803 in a manner similar to that discussed above in connection with FIG. 1), the control unit 801 retrieves the first new email message from the email memory 809 and performs a text-to-voice conversion process on the email. In some embodiments, the conversion process is performed using the PARABEN VOICE-TO-TEXT™ software available from Paraben Corporation, which outputs a .wav file. The control unit 801 passes the .wav file to sound card 830 (A "sound card 830" should be understood to refer to a circuit that performs the function of what is commonly referred to as a sound card in the computer art and should not be understood as a requirement that such a circuit resides on a separate printed circuit board or chip). Sound card 830 converts the .wav file to analog electrical signals, which are then output to a speaker 840 so that the user may listen to the email message. In some embodiments, if the user depresses switch 804 while an email is being read, the control unit 801 will stop reading the email being read and begin reading the next email.

It should be noted that power for the various systems and circuits included in the floor mats discussed above may come from long-life batteries included within the floor mat. In other embodiments, a connection from the floor mat to a vehicle's electrical system is provided. In yet other embodiments (e.g., the transponder embodiment of FIG. 7), power is generated when an electric field from an external source generates a current in a coil in the floor mat in a manner well known in the transponder art.

It should also be understood that the various embodiments discussed herein are not mutually exclusive and that one or all of the circuits and functions discussed herein may be integrated into a single floor mat. Moreover, one or more circuits of the same type may also be present in a single floor mat. Thus, in some embodiments of the invention a floor mat includes both a circuit for controlling a remotely controllable device and a transponder. Similarly, some embodiments of the invention are capable of controlling multiple remotely controllable devices (e.g., a garage door opener and a lighting system) and therefore include multiple switches preferably spaced apart in different locations in the floor mat.

Obviously, numerous other modifications and variations of the present invention are possible in light of the above teachings. It is therefore to be understood that within the scope of the appended claims, the invention may be practiced otherwise than as specifically described herein.

What is claimed is:

1. A floor mat comprising:
   a mat portion, the mat portion being sized and shaped to fit a driver side floor portion of an automobile, the driver side floor portion having a three dimensional shape, the mat portion including at least one indentation corresponding to the driver side floor portion; and
   a circuit attached to the mat portion, the circuit comprising
      a transceiver, the transceiver being configured to communicate with a wireless email device;
      a control unit connected to the transceiver;
      a memory device connected to the control unit;
      a sound device connected to the control unit; and
      a speaker connected to the sound device;
   wherein the control unit is configured to perform a text-to-voice conversion process on an email received from the wireless email device and output a signal representative of the contents of the email to the sound device to produce an audible, spoken representation of the contents of the email via the speaker.

2. The floor mat of claim 1, wherein the transceiver is a wireless transceiver.

3. The floor mat of claim 2, wherein the wireless transceiver is a BLUETOOTH™ transceiver.

4. The floor mat of claim 1, wherein the sound device is a sound card.

5. The floor mat of claim 1, wherein the circuit further comprises a switch connected to the control unit, and wherein the control unit is configured to halt a text-to-voice conversion process for a first email and begin a text-to-voice conversion process for a second email upon detecting that the switch has been operated.

6. The floor mat of claim 1, wherein the control unit is configured to synchronize with the wireless email device such that emails stored in the wireless email device are downloaded to the memory device.

7. The floor mat of claim 6, wherein the synchronization occurs wirelessly via the transceiver, and wherein the transceiver is a wireless transceiver.

8. The floor mat of claim 1, wherein a .wav file is output by the text-to-voice conversion process.

9. An automobile comprising:
   an automobile body, the automobile body including a driver side floor portion having a three dimensional shape; and
   a floor mat, the floor mat including
   a mat portion, the mat portion being sized and shaped to fit a driver side floor portion of an automobile, the driver side floor portion having a three dimensional shape, the mat portion including at least one indentation corresponding to the driver side floor portion; and
   a circuit attached to the mat portion, the circuit comprising
      a transceiver configured to communicate with a wireless email device, a control unit connected to the transceiver, a memory device connected to the control unit, a sound device connected to the control unit, and a speaker connected to the sound device;
   wherein the control unit is configured to perform a text-to-voice conversion process on an email received from the wireless email device and output a signal representative of the contents of the email to the sound device to produce an audible, spoken representation of the contents of the email via the speaker.

10. The automobile of claim 9, wherein the transceiver is a wireless transceiver.

11. The automobile of claim 10, wherein the wireless transceiver is a BLUETOOTH™ transceiver.

12. The automobile of claim 9, wherein the sound device is a sound card.

13. The automobile of claim 9, wherein the circuit further comprises a switch connected to the control unit, and wherein the control unit is configured to halt a text-to-voice conversion process for a first email and begin a text-to-voice conversion process for a second email upon detecting that the switch has been operated.

14. The automobile of claim 9, wherein the control unit is configured to synchronize with the wireless email device such that emails stored in the wireless email device are downloaded to the memory device.

15. The automobile of claim 14, wherein the synchronization occurs wirelessly via the transceiver, and wherein the transceiver is a wireless transceiver.

16. The automobile of claim 9, wherein a .wav file is output by the text-to-voice conversion process.

\* \* \* \* \*